United States Patent
Adachi et al.

(10) Patent No.: US 8,112,177 B2
(45) Date of Patent: Feb. 7, 2012

(54) WAFER POSITION TEACHING METHOD AND TEACHING TOOL

(75) Inventors: Masaru Adachi, Fukuoka (JP); Mitsunori Kawabe, Fukuoka (JP)

(73) Assignee: Kabushiki Kaisha Yaskawa Denki, Kitakyushu-shi, Fukuoka (JP)

(*) Notice: Subject to any disclaimer, the term of this patent is extended or adjusted under 35 U.S.C. 154(b) by 566 days.

(21) Appl. No.: 11/995,786

(22) PCT Filed: Jun. 29, 2006

(86) PCT No.: PCT/JP2006/313027
§ 371 (c)(1), (2), (4) Date: Feb. 13, 2009

(87) PCT Pub. No.: WO2007/010725
PCT Pub. Date: Jan. 25, 2007

(65) Prior Publication Data
US 2009/0198377 A1 Aug. 6, 2009

(30) Foreign Application Priority Data
Jul. 15, 2005 (JP) .................. 2005-206304

(51) Int. Cl.
*G05B 19/18* (2006.01)
(52) U.S. Cl. ........ 700/250; 700/245; 700/247; 700/258; 700/275; 414/730; 414/744.3; 414/744.5; 414/757; 414/394
(58) Field of Classification Search .................. 700/245, 700/247, 258, 275; 414/416.09, 730, 744.3, 414/744.5, 757, 394, 783, 816, 936, 941
See application file for complete search history.

(56) References Cited

U.S. PATENT DOCUMENTS

| 5,243,266 A | * | 9/1993 | Kasagami et al. | 318/568.1 |
| 6,019,606 A | * | 2/2000 | Yamamoto et al. | 434/45 |
| 6,032,083 A | | 2/2000 | Oosawa | |
| 6,124,693 A | * | 9/2000 | Okanda et al. | 318/568.11 |

(Continued)

FOREIGN PATENT DOCUMENTS

JP 8335622 A 12/1996
(Continued)

OTHER PUBLICATIONS

International Search Report of PCT/JP2006/313027, date of mailing Sep. 19, 2006.
(Continued)

*Primary Examiner* — James Trammell
*Assistant Examiner* — McDieunel Marc
(74) *Attorney, Agent, or Firm* — Westerman, Hattori, Daniels & Adrian, LLP

(57) ABSTRACT

In the wafer position teaching method for a wafer carrying system, a teaching tool is mounted at a position of the container or the processing equipment where the semiconductor wafer is to be set. The teaching tool is sensed by a sensor provided at a wafer gripping portion of the robot. Prior to sensing the teaching tool by the sensor, external teaching tools mounted on a front external wall of the processing equipment are sensed by the sensor to roughly estimate the position of the teaching tool. Based on the estimated position, the sensor approaches and senses the teaching tool to obtain the position of the semiconductor wafer. Thus, the wafer position can be taught precisely and automatically without causing interference, even when the frontage of processing equipment is narrow.

6 Claims, 10 Drawing Sheets

U.S. PATENT DOCUMENTS

| | | | |
|---|---|---|---|
| 6,256,555 B1 * | 7/2001 | Bacchi et al. | 700/245 |
| 6,275,748 B1 * | 8/2001 | Bacchi et al. | 700/275 |
| 6,360,144 B1 * | 3/2002 | Bacchi et al. | 700/250 |
| 6,366,830 B2 * | 4/2002 | Bacchi et al. | 700/250 |
| 6,438,460 B1 * | 8/2002 | Bacchi et al. | 700/275 |
| 6,453,214 B1 * | 9/2002 | Bacchi et al. | 700/245 |
| 6,618,645 B2 * | 9/2003 | Bacchi et al. | 700/254 |
| 6,898,487 B2 * | 5/2005 | Bacchi et al. | 700/275 |
| 7,039,498 B2 * | 5/2006 | Bacchi et al. | 700/245 |
| 7,233,842 B2 * | 6/2007 | Bacchi et al. | 700/245 |
| 7,353,082 B2 * | 4/2008 | Pretlove et al. | 700/264 |
| 7,391,178 B2 * | 6/2008 | Tanaka et al. | 318/568.2 |
| 7,424,341 B2 * | 9/2008 | Watanabe et al. | 700/245 |
| 2004/0172164 A1 * | 9/2004 | Habibi et al. | 700/245 |
| 2004/0199288 A1 * | 10/2004 | Watanabe et al. | 700/245 |
| 2004/0243282 A1 * | 12/2004 | Watanabe et al. | 700/245 |
| 2004/0253091 A1 | 12/2004 | Iida et al. | |
| 2005/0034288 A1 | 2/2005 | Adachi et al. | |
| 2005/0049749 A1 * | 3/2005 | Watanabe et al. | 700/245 |
| 2005/0143861 A1 * | 6/2005 | Watanabe et al. | 700/264 |
| 2008/0004750 A1 * | 1/2008 | Ban et al. | 700/245 |

FOREIGN PATENT DOCUMENTS

| | | |
|---|---|---|
| JP | 2001-158507 A | 6/2001 |
| JP | 2005-011853 A | 1/2005 |
| JP | 2005310858 A | 11/2005 |
| WO | 2003022534 A1 | 3/2003 |

OTHER PUBLICATIONS

Japanese Office Action dated Jul. 14, 2011, issued in corresponding Japanese Patent Application No. 2007-525926.

* cited by examiner

WAFER POSITION TEACHING METHOD AND TEACHING TOOL

RELATED APPLICATIONS

This application is a continuation-in-part of an International Patent Application No. PCT/JP2006/313027, filed on Jun. 29, 2006. This application claims priority under 35 U.S.C. §119 to Japanese Patent Application No. 2005-206304 filed on Jul. 15, 2005. Each of the entire disclosures of these applications is incorporated herein by reference in its entirety.

BACKGROUND OF THE INVENTION

1. Field of the Invention

The present invention relates to a method for teaching a position of a semiconductor wafer to a semiconductor wafer carrying robot, and more specifically to an external teaching tool for use in the method.

2. Description of Related Art

Conventionally, in the same manner as in a general industrial robot, a teaching operation of a semiconductor carrying robot has been performed by an operator by guiding the robot to a wafer to be carried while visually recognizing the wafer position. In some cases, however, it is difficult, or even impossible, to visually recognize the wafer disposed in a processing equipment or the like from the outside thereof. Under the circumstances, a so-called automatic teaching method/apparatus for teaching a wafer position to a robot has been proposed. In such a method/apparatus, a teaching tool having the same size as that of an actual wafer is disposed in a processing equipment, etc., in place of a wafer and the position of the teaching tool is taught to the robot by detecting the teaching tool with a sensor mounted on the end effector of the robot.

The present inventors previously proposed a method for sensing a teaching tool using a hand having two transmission-type sensors (see, e.g., International Publication WO 03/22534). In a conventional wafer position teaching method, the operation for automatically moving a wafer gripping portion of the robot to the vicinity of the teaching tool to sense the teaching tool with the sensor mounted on the wafer gripping portion is performed based on the taught position (hereinafter referred to as "pre-taught position") calculated from the device design drawing in advance. Also proposed by the present inventors was a method in which the operation for moving the wafer gripping portion to the vicinity of the teaching tool is performed manually (see, e.g., Japanese Unexamined Laid-open Patent Publication No. 2005-123261). In order to enhance the rate of automation to shorten the teaching operation time, it is preferable to move the wafer gripping portion automatically.

In a conventional method, however, if the installation accuracy of a processing equipment with respect to a robot is poor, in the case of equipment having a small inlet opening (hereinafter referred to as "frontage"), there is a problem that a wafer gripping portion may hit against the processing equipment when the wafer gripping portion approaches the teaching tool.

SUMMARY OF THE INVENTION

The present invention was made in view of the aforementioned problems and aims to provide a method for precisely and automatically teaching a semiconductor wafer position, even in processing equipment with a narrow frontage, without causing interference between a wafer gripping portion and the equipment, by sensing a teaching position of external teaching tools mounted on a front external wall of the equipment in advance to correct the pre-taught position. Furthermore, the present invention also aims to provide an external teaching tool which does not narrow a robot operation range for a normal wafer carrying operation despite mounting of the external teaching tools and the mounting method thereof.

In order to solve the aforementioned problems, the present invention is configured as follows.

According to a first aspect of the invention, a method for teaching a position of a semiconductor wafer to a robot for carrying the semiconductor wafer between a container and processing equipment or among processing equipments, comprises the steps of:

mounting an internal teaching tool at an internal position of the container or the processing equipment where the semiconductor wafer is to be set;

sensing an external teaching tool mounted on a front external wall of the processing equipment with a sensor provided at a wafer gripping portion of the robot to roughly estimate the position of the internal teaching tool; and approaching the internal teaching tool with the sensor based on the estimated position of the internal teaching tool and sensing the internal teaching tool to determine the position of the internal teaching tool, wherein at least two external teaching tools are mounted on the front external wall of the processing equipment in a horizontally offset manner.

According to a second aspect of the invention, a teaching tool system comprises an external teaching tool for preliminary performing a sensing operation to teach a position of a semiconductor wafer to a robot for carrying the semiconductor wafer between a container and a processing equipment or among processing equipments; and an internal teaching tool mounted in the processing equipment, wherein at least two external teaching tools are mounted on a front external wall of the processing equipment in a horizontally offset manner.

According to the invention, sensing two or more external teaching tools arranged in a horizontally offset manner enables detection of the inclination of the processing equipment with respect to the robot, which in turn makes it possible to estimate the position of the semiconductor wafer with a high degree of accuracy.

Furthermore, by sensing the external teaching tools mounted on the front external wall of the equipment to estimate the position of the teaching tool, replacing the pre-taught position calculated from the equipment design drawing stored in a controller with the estimated position, and making the robot approach the teaching tool based on the corrected pre-taught position, the robot can be guided to the teaching tool without causing interference of the wafer gripping portion with the equipment. When the wafer gripping portion approaches the teaching tool, the semiconductor wafer position can be automatically taught, even in an equipment having a narrow frontage.

DETAILED DESCRIPTION OF THE INVENTION

Hereinafter, a concrete embodiment of a method according to the present invention will be explained with reference to the drawings.

Example 1

Figure 1:
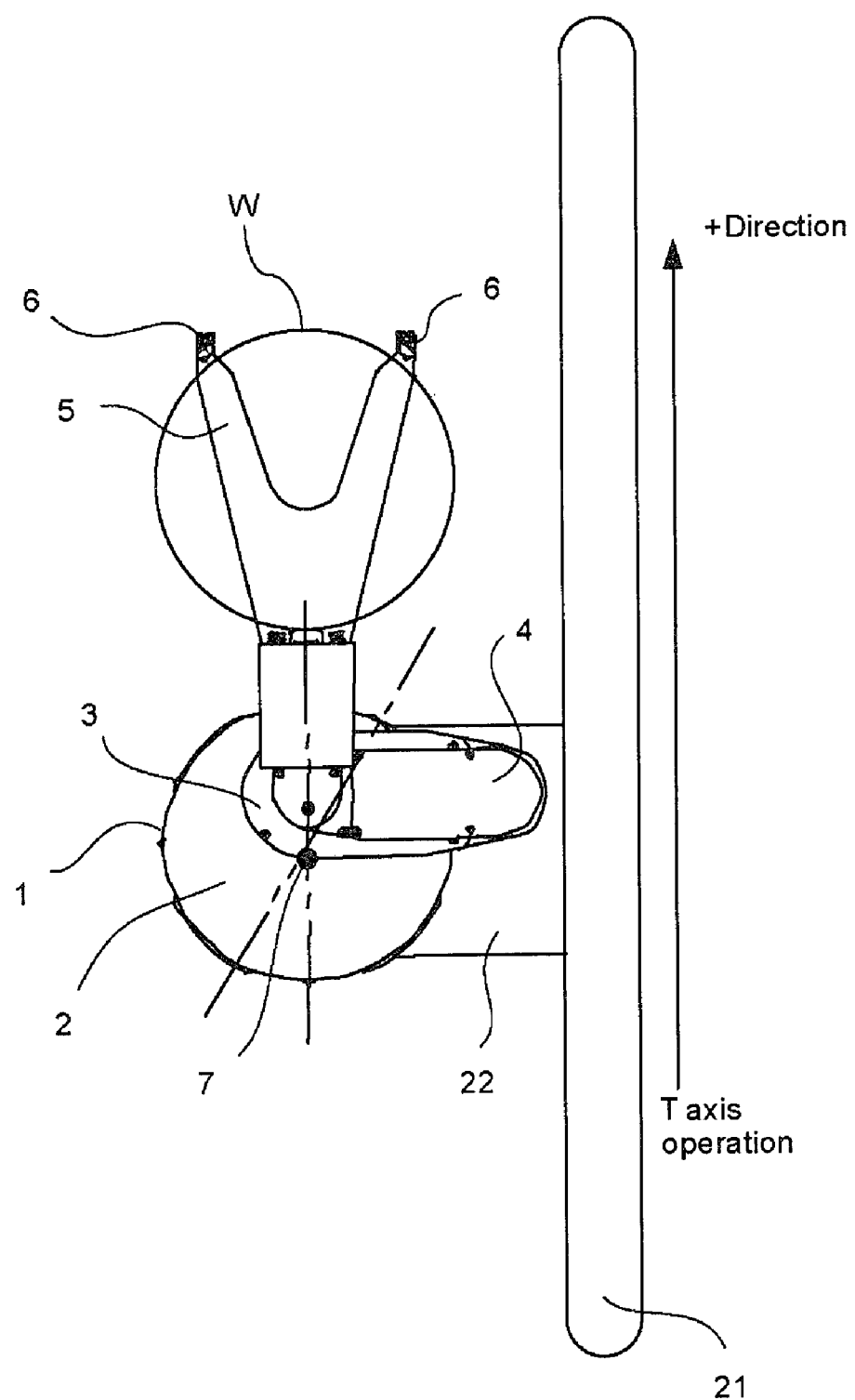
FIG. 1 is a top view showing a traveling motion of a robot using the present invention.
Figure 4:
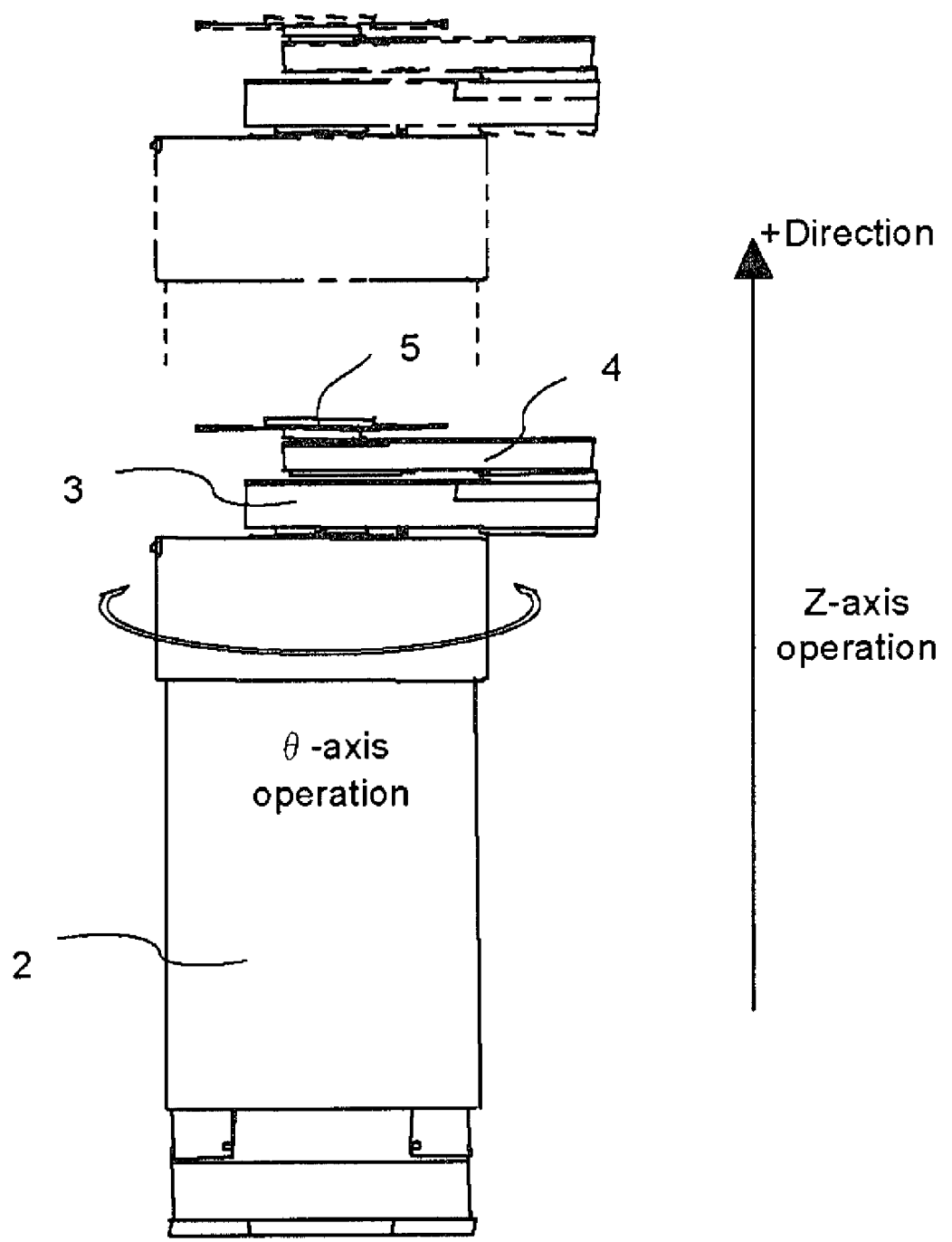
FIG. 4 is a side view showing a raising and lowering operation of the robot using the present invention.

FIG. 1 is top view showing a robot of an embodiment according to the present invention. FIG. 4 is a side view thereof.

In FIG. 1, the reference numeral "1" denotes a horizontal articulated type robot for carrying a semiconductor wafer, and "W" denotes a semiconductor wafer to be carried by the robot. The robot 1 is equipped with a first arm 3 capable of rotating about a robot rotational center axis 7 of an elevating columnar support portion 2 in a horizontal plane, a second arm 4 attached to the tip end of the first arm 3 in a rotatable manner in a horizontal plane, and a wafer gripping portion 5 attached to the tip end of the second arm 4 in a rotatable manner in a horizontal plane. The wafer gripping portion 5 is formed into a Y-shaped hand for placing a semiconductor wafer W thereon and provided with a pair of transmission-type sensors 6 at the tip ends thereof. The reference numeral "21" denotes a traveling axis unit, and "22" denotes a traveling axis robot mount. The robot 1 is fixed to the traveling axis robot mount 22.

Figure 2:
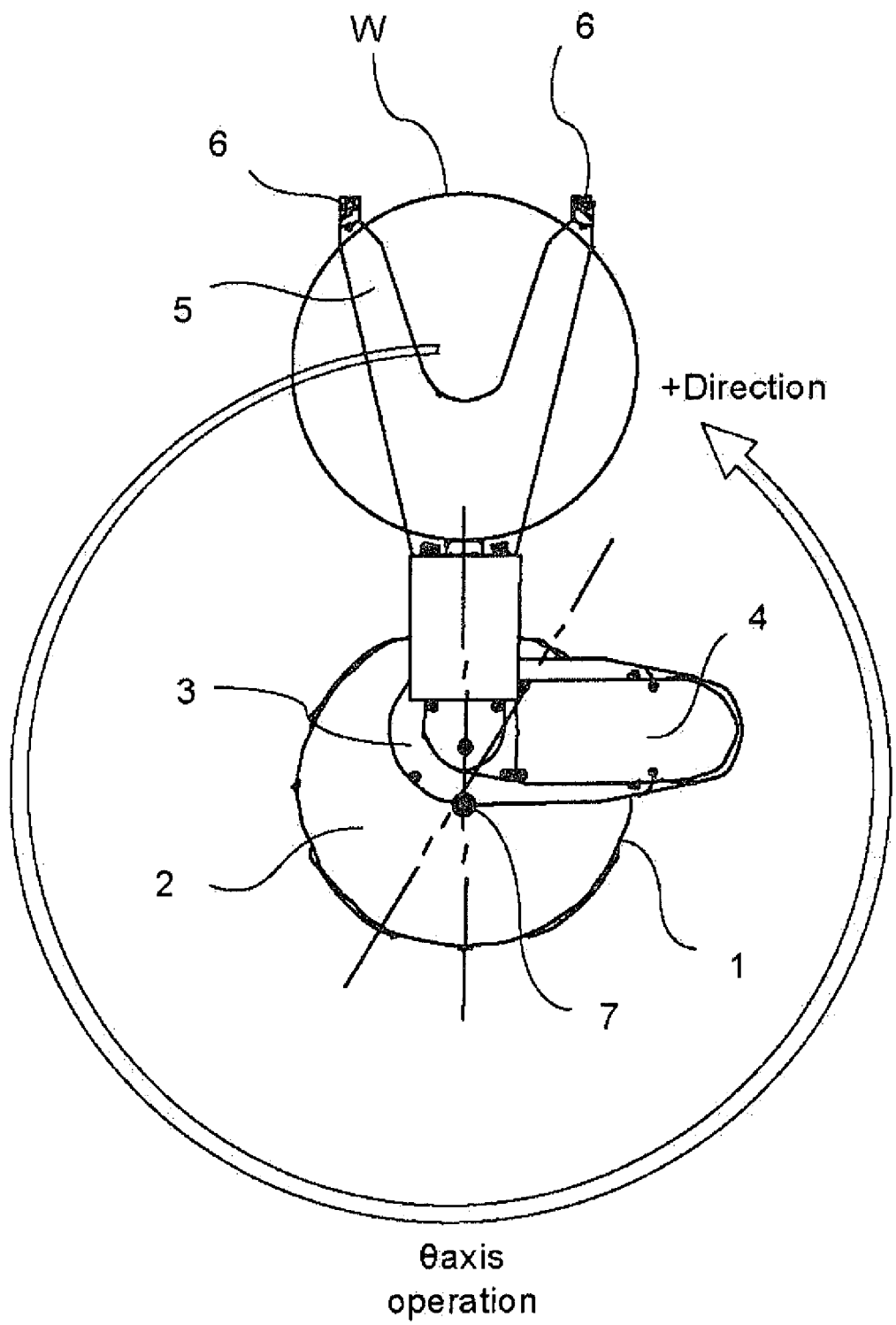
FIG. 2 is a top view showing a turning operation of the robot using the present invention.
Figure 3:
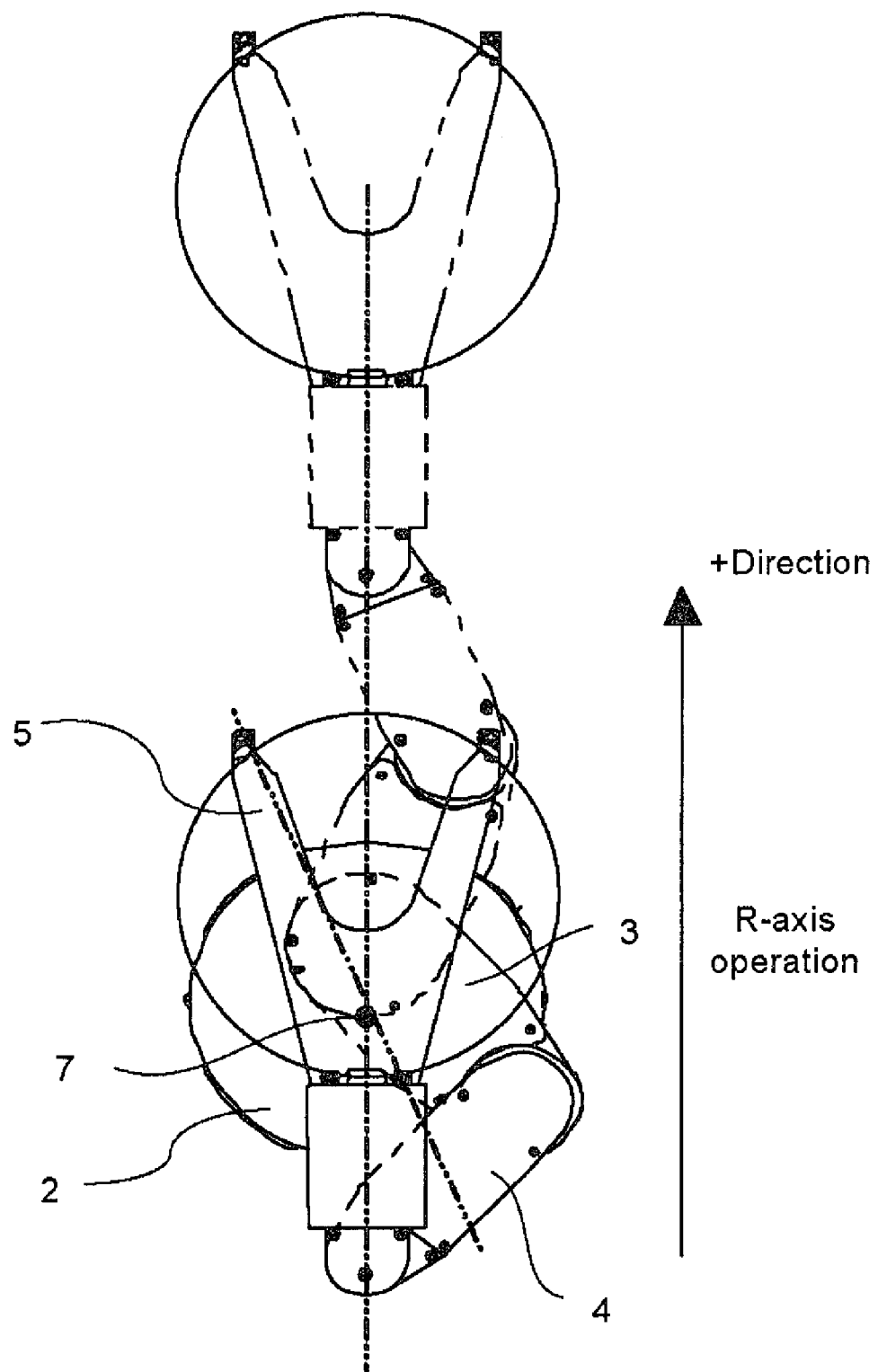
FIG. 3 is a top view showing a stretching and shortening operation of the robot using the present invention.

The robot 1 has the following four degrees of freedom: a θ-axis operation (turning operation) as shown in the plan view of FIG. 2 in which the first arm 3 can be rotated about the central axis 7 of the support portion 2 while keeping the relative angle of the first arm 3, the second arm 4 and the wafer gripping portion 5; an R-axis operation (stretching and shortening operation) shown in the plan view of FIG. 3 in which the wafer gripping portion 5 can be stretched and shortened in the radial direction of the support portion 2 by rotating the first arm 3, the second arm 4 and the wafer gripping portion 5 while keeping their constant speed ratio; a Z-axis operation (raising and lowering operation) for raising and lowering the support portion 2 as show in FIG. 4; and a T-axis operation (traveling operation) as shown in FIG. 1 in which the robot 1 itself can travel in accordance with the linear movement of the traveling axis unit 21.

In the θ-axis, the counterclockwise rotational direction is defined as a plus direction (see FIG. 2). In the R-axis, the direction of distancing the wafer gripping portion 5 from the support portion 2, i.e., the arm stretching direction, is defined as a plus direction (see FIG. 3). In the Z-axis, the direction of raising the support portion 2 is defined as a plus direction (see FIG. 4). In the T-axis, the direction of making the robot travel toward the upper portion of the drawing is defined as a plus direction (see FIG. 1).

Figure 5:
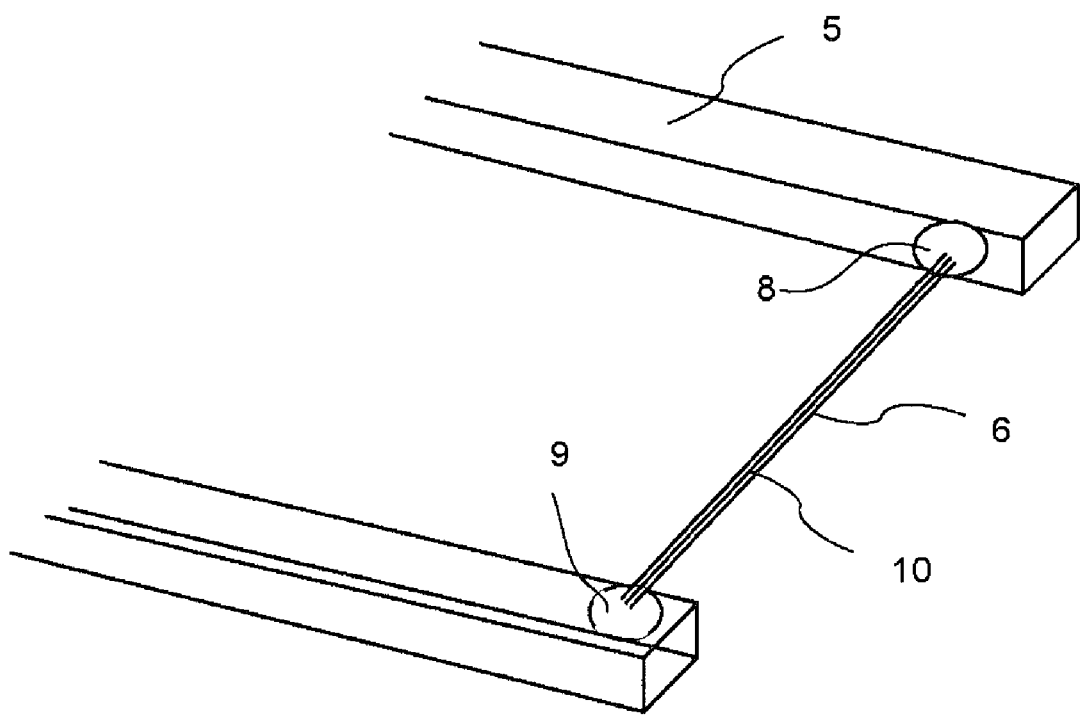
FIG. 5 is a perspective view showing a transmission-type sensor shown in FIG. 1.

FIG. 5 is a perspective view showing the detail of the wafer gripping portion 5. In FIG. 5, the reference numeral "8" denotes a light-emitting portion attached to one end of the Y-shaped wafer gripping portion 5, and "9" denotes a light-receiving portion attached to the other end of the wafer gripping portion 5 so as to be opposed to the light-emitting portion 8. The light-emitting portion 8 and the light-receiving portion 9 constitute transmission-type sensors 6. The reference numeral "10" denotes the optical axis extending from the light-emitting portion 8 to the light-receiving portion 9. The transmission-type sensors 6 can detect an object interrupting the optical axis 10.

Figure 6:
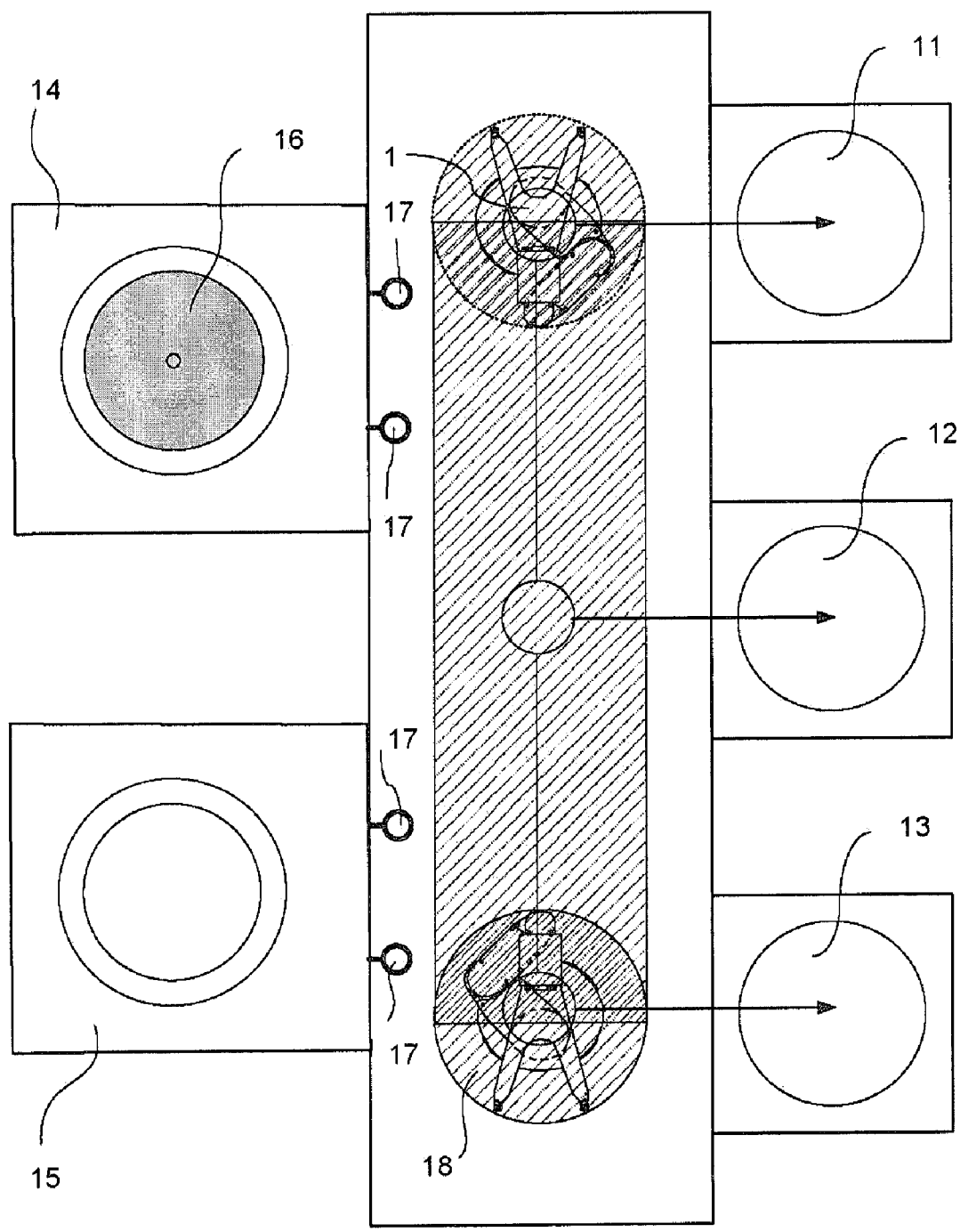
FIG. 6 is a top view showing a wafer carrying system according to the present invention.

FIG. 6 is a top view showing the overall layout of the wafer carrying system of the present invention.

In FIG. 6, the reference numerals "14" and "15" denote processing equipments, "11", "12" and "13" denote containers, "16" denotes a teaching tool, "17" denotes an external teaching tool, and "18" denotes a moving range of the robot 1 taking the minimal turning position. Each of the processing equipments 14 and 15 is provided with two external teaching tools 17. The external teaching tools 17 are arranged outside the moving range 18 of the robot 1 taking the minimal turning position. This arrangement enables the moving of the robot 1 taking the minimal turning position along the traveling axis without causing interference with the external teaching tools 17 in the same manner as in conventional equipment regardless of the arrangements of the external teaching tools 17. Needless to say, the same movable range of the robot 1 as in a conventional system can be secured if the external teaching tools 17 are detachably connected. Furthermore, in this embodiment, the front walls of the containers are provided with no external teaching tool 17 because of the sufficiently large frontage.

Figure 7:
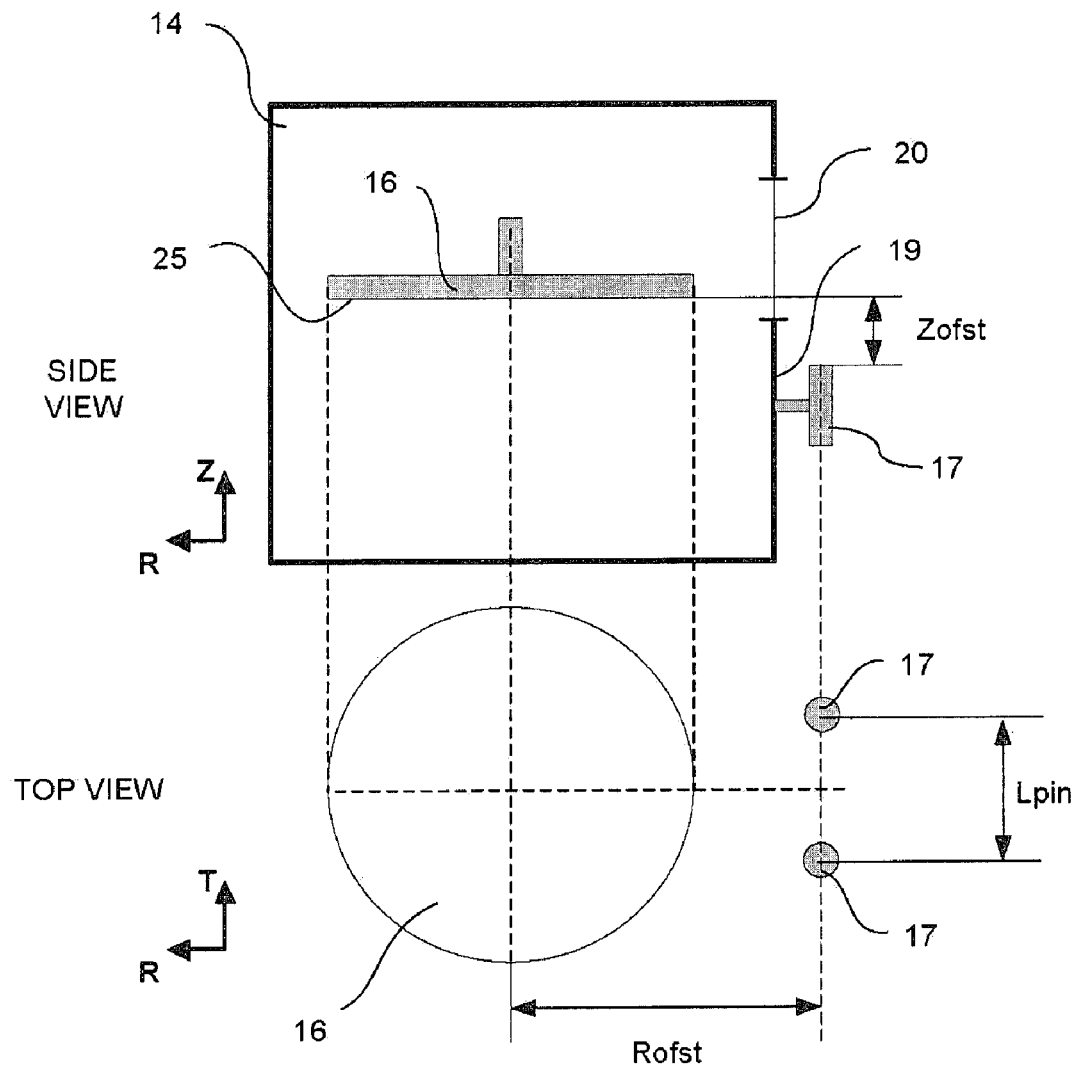
FIG. 7 is an explanatory view showing the mounting status of the external teaching tools according to the present invention.

FIG. 7 shows the side view and the top view of the processing equipment 14 to which two external teaching tools 17 are attached. In FIG. 7, the reference numeral "25" denotes a wafer carrying surface, "19" denotes the front wall of the processing equipment, "20" denotes the frontage of the processing equipment 14, "Zofst" denotes a distance between the wafer carrying surface 25 and the upper surface of the external teaching tool 17, and "Rofst" denotes a distance between the center of the teaching position and the center of the external teaching tool 17 on the drawing.

Two external teaching tools 17 are mounted on the front wall 19 of the processing equipment so that each external teaching tool is located at a position where the center of each external teaching tool 17 is horizontally separated from the front of the center of the teaching tool 16 located in the processing equipment 14 by a distance of Lpin/2. That is, the distance between two external teaching tools 17 is "Lpin." Like "Zoft" and "Rofst," since "Lpin" is a known value at the time of designing the mounting location of the external teaching tools 17, it is a value to be previously set to the controller. Since the relative position of the two external teaching tools 17 with respect to the teaching tool 16 can be decided, it becomes possible to estimate the position of the teaching tool 16 when the positions of two external teaching tools 17 are known.

Figure 8:
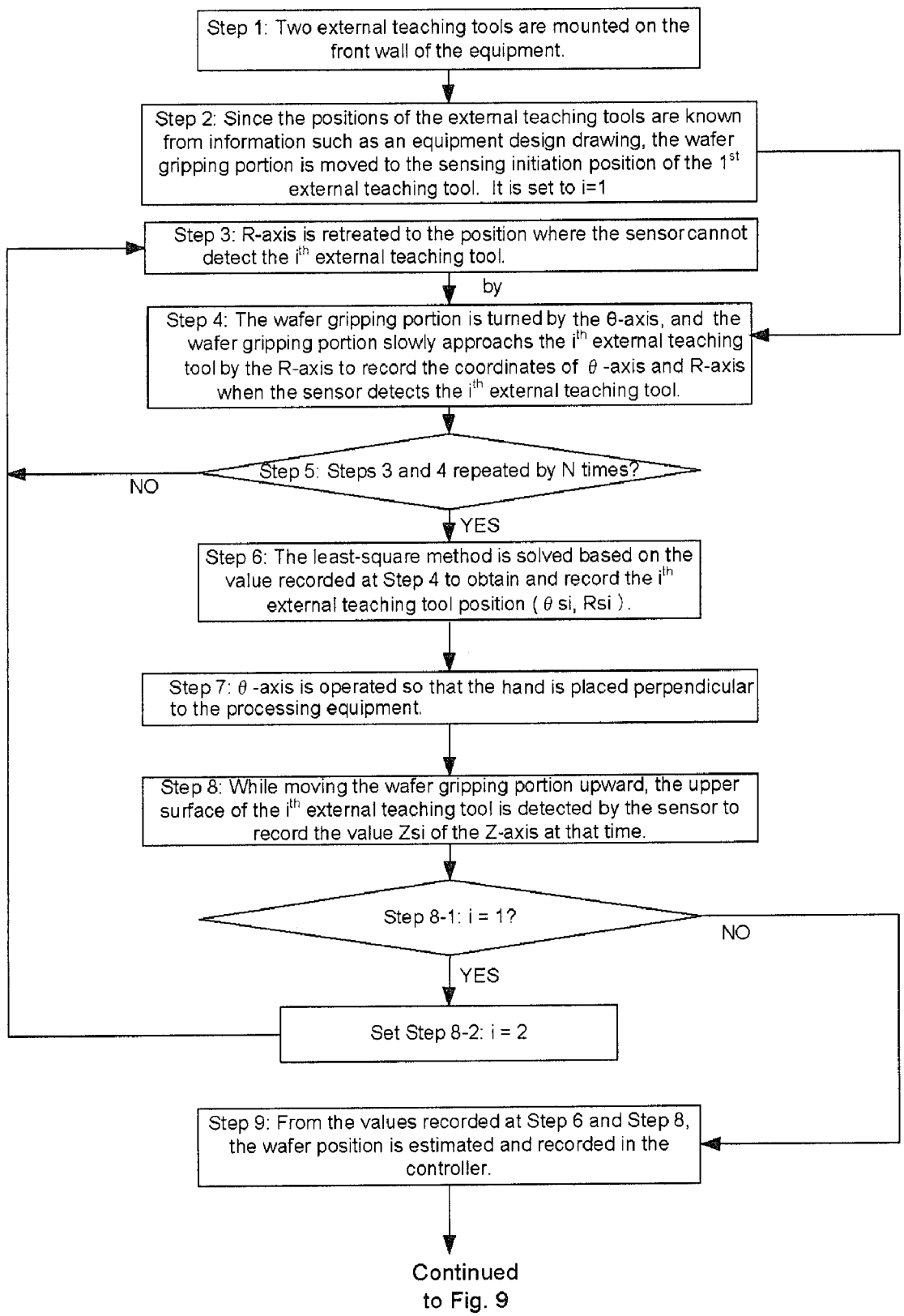
FIG. 8 is a flowchart showing the operation of the present invention.
Figure 9:
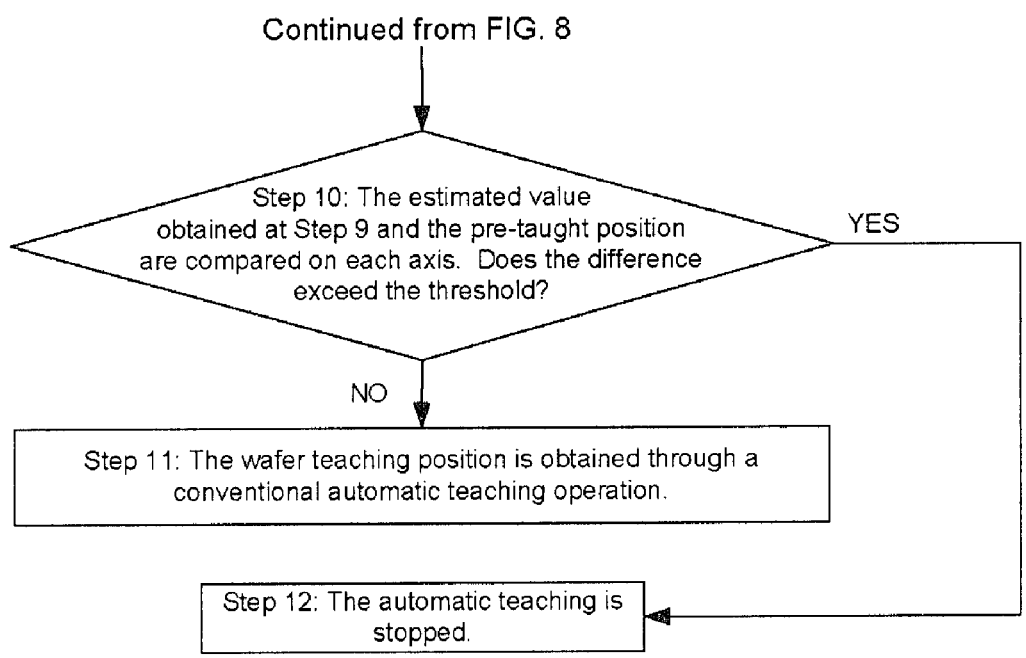
FIG. 9 is a flowchart continued from the flowchart of FIG. 8.

FIGS. 8 and 9 are flowcharts showing a position detecting method of the two external teaching tools 17. Hereinafter, this position detecting method will be explained by step.

(Step 1)

Two external teaching tools 17 are mounted on the front wall 19 of the processing equipment.

(Step 2)

Since the mounting locations of the external teaching tools 17 are already known from the information such as the equipment design drawing, the wafer gripping portion 5 can be moved to the sensing initiation location of the $1^{st}$ external teaching tools 17. By skipping Step 3, the routine proceeds to Step 4. The variable number "i" is set to 1.

(Step 3)

The R-axis of the robot is retreated to the position where the transmission-type sensors 6 do not detect the $i^{th}$ external teaching tool 17.

(Step 4)

The direction of the wafer gripping portion 5 is changed by operating the O-axis, and then the wafer gripping portion 5 is advanced by operating the R-axis to slowly approach the wafer gripping portion 5 toward the $i^{th}$ external teaching tool 17. Then, the coordinates of the O-axis and the R-axis where the transmission-type sensor 6 initially detects the external teaching tool 17 (i.e., when the optical axis 10 comes into contact with the circumference of the external teaching tool 17) are recorded.

(Step 5)

After repeating Step 3 and Step 4 by N times, the routine proceeds to Step 6. Otherwise, the routine returns to Step 3. The "N" is any value of 3 or more.

(Step 6)

After repeating Step 3 and Step 4 by N times, the wafer gripping portion 5 approaches the $i^{th}$ external teaching tool 17 from different directions to thereby obtain a plurality of coordinates of the θ-axis and the R-axis where the optical axis 10 comes into contact with the circumference of the $i^{th}$ external teaching tool 17. The least-square method is solved from these values to obtain and record the central position (θsi, Rsi) of the $i^{th}$ external teaching tool 17. The calculation method is detailed in International Publication WO 03/22534.

(Step 7)

The wafer gripping portion 5 is moved so as to be placed perpendicular to the processing equipment 14 by operating the θ-axis. Further, the R-axis is advanced by about 10 mm and the Z-axis is operated so that the transmission-type sensor 6 takes a position where it can assuredly detect the $i^{th}$ external teaching tool 17.

(Step 8)

While slowly moving the wafer gripping portion 5 upward by operating the Z-axis, the value of the Z-axis is recorded as Zsi when the transmission-type sensor 6 becomes undetectable of the upper surface of the $i^{th}$ external teaching tool 17 (i.e., when the optical axis 10 is moved beyond the upper surface of the external teaching tool 17).

(Step 8-1)

If i=1, the routine proceeds to Step 8-2. Otherwise, the routine proceeds to Step 9.

(Step 8-2)

The routine proceeds to Step 3 after setting i=2.

(Step 9)

Using the values recorded at Step 6 and Step 8, "Rofst," "Zofst, and "Lpin" previously set in the controller, the wafer teaching position in the processing equipment 14 is obtained. The calculation method will be detailed in the next section. The estimated wafer teaching position is recorded separately from the pre-taught position previously held by the controller. The pre-taught position previously set in the controller is defined as "Pos1" ($\theta_1$, $R_1$, $Z_1$, $T_1$), and the estimated teaching position 24 obtained by this sensing is defined as "Pos2" ($\theta_2$, $R_2$, $Z_2$, $T_2$).

(Step 10)

"Pos1" and "Pos2" are compared on each axis. If one or more axes exceed a threshold value "Thold" ($\theta_t$, $R_t$, $Z_t$, $T_t$) set for each axis, the automatic teaching is stopped and the routine proceeds to Step 12. This is because it indicates that the set position of the processing equipment 14 on the drawing and the actually set position are shifted substantially and therefore it is necessary to confirm the installation state before performing the automatic teaching.

(Step 11)

"Pos1" obtained at Step 9 is overwritten as a pre-taught position in the controller and then a conventional automatic teaching operation is performed. When a conventional automatic teaching is completed normally, the correct teaching position of the processing equipment 14 can be obtained.

(Step 12)

The arm of the robot 1 is folded into the minimal turning posture and the automatic teaching is terminated.

Figure 10:
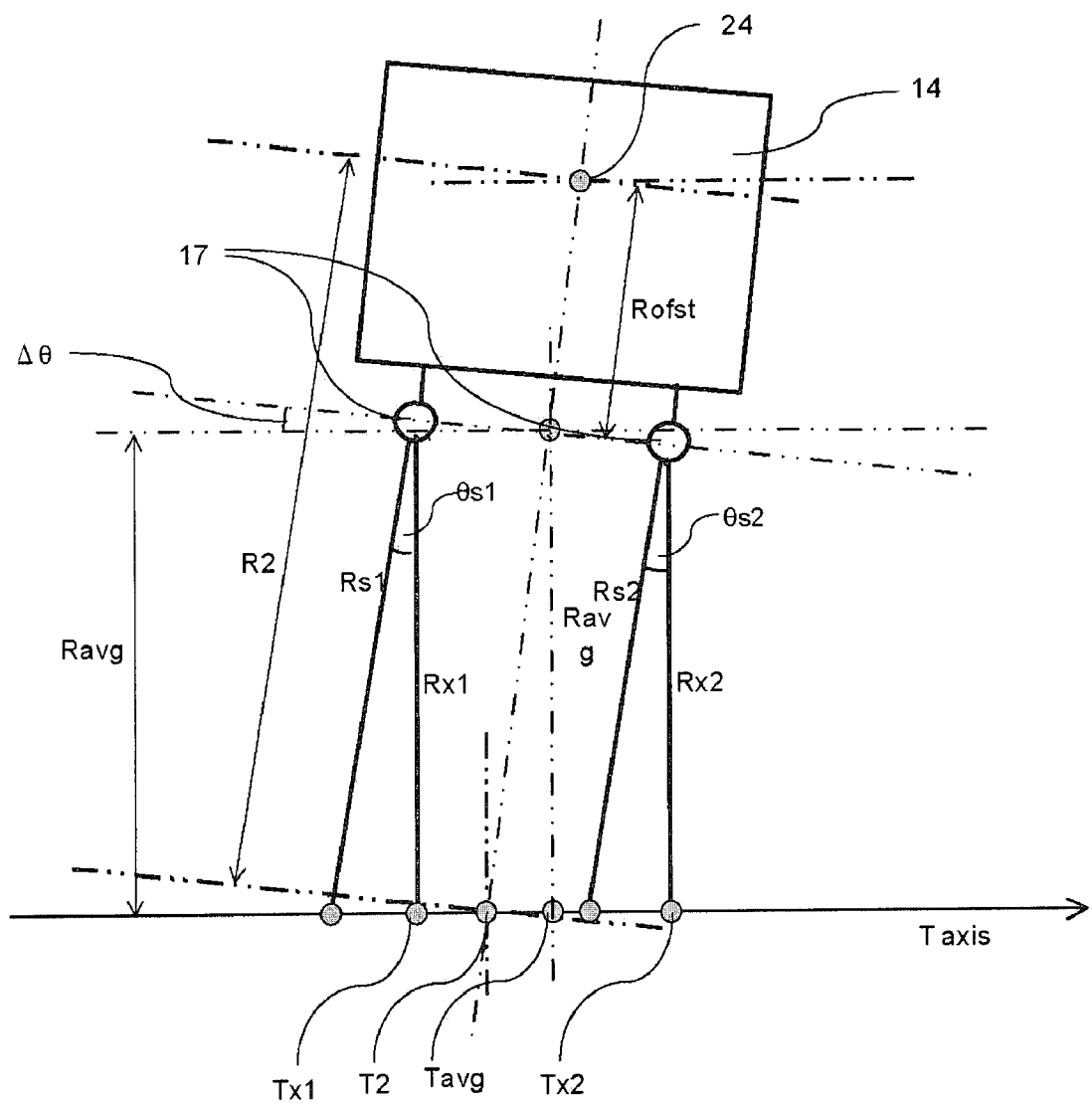
FIG. 10 is an explanatory view showing the teaching position estimation method according to the present invention.

FIG. 10 is an explanatory view explaining the wafer position estimating method of the present invention. With reference to FIG. 10, a method for estimating the position of the teaching tool 16 in the processing equipment from the estimated position of the two external teaching tools 17 explained at Step 9 will be explained. In FIG. 10, $R_{xi}$ can be calculated from the ($\theta_{si}$, $R_{si}$) obtained at Step 6 and is a distance from the T axis to the center of the $i^{th}$ external teaching tool 17. The average value of $R_{x1}$ and $R_{x2}$ is represented by $R_{avg}$ (Formula 1). $T_{xi}$ can be calculated from ($\theta_{si}$, $R_{si}$) obtained at Step 6 and is a value of the T axis which corresponds to the front of the $i^{th}$ external teaching tool 17. The average value of $T_{x1}$ and $T_{x2}$ is represented by $T_{avg}$ (Formula 3). Δθ is an inclination of the processing equipment 14 with respect to the T axis, which can be obtained from Formula (4). Furthermore, the average value of $Z_{si}$ obtained at Step 8 is represented by $Z_{avg}$ (Formula 2). From these values, the wafer position Pos2 ($\theta_2$, $R_2$, $Z_2$, $T_2$) can be obtained from Formulas (5) to (8).

$$R_{avg}=(R_{x1}+R_{x2})/2 \tag{1}$$

$$Z_{avg}=(Z_1+Z_2)/2 \tag{2}$$

$$T_{avg}=(T_{x1}+T_{x2})/2 \tag{3}$$

$$\Delta\theta=\sin^{-1}((R_{x1}-R_{x2})/L_{pin}) \tag{4}$$

$$\theta_2=90°-\Delta\theta \tag{5}$$

$$R_2=R_{ofst}+R_{avg}/\cos\Delta\theta \tag{6}$$

$$Z_2=Z_{avg}+Z_{ofst} \tag{7}$$

$$T_2=T_{avg}-R_{avg}*\tan\Delta\theta \tag{8}$$

As discussed above, since the pre-taught position can be corrected by Pos2, the passage of the wafer gripping portion 5 for approaching the teaching tool 16 mounted in the processing equipment 14 can be corrected. Thus, the wafer gripping portion 5 can be prevented from interfering with the equipment when the wafer gripping portion 5 passes through the frontage 20 of the processing equipment.

The present invention can be useful as a method for teaching a position of a semiconductor wafer to a semiconductor wafer carrying robot.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. A method for teaching a position of a semiconductor wafer to a robot for carrying the semiconductor wafer between a container and processing equipment or among processing equipments, comprising:
    sensing at least two external teaching tools mounted on a front external wall of the container or processing equipment with a sensor provided at a wafer gripping portion of the robot controlled by a controller; and then
    roughly estimating an estimated position of an internal teaching tool at an internal position of the container or processing equipment where the semiconductor wafer is to be set using a controller, based on the sensing of said at least two external teaching tools by the sensor; and then
    approaching the internal teaching tool with the sensor provided at the wafer gripping portion of the robot controlled by the controller, based on the estimated position of the internal teaching tool and sensing the internal teaching tool to determine the position of the internal teaching tool,
    wherein said at least two external teaching tools are mounted on the front external wall of the container or processing equipment in a horizontally offset manner.

2. The method for teaching a position of a wafer according to claim 1, wherein the controller only controls the wafer gripping portion of the robot to approach the internal teaching tool to sense the internal teaching tool using the sensor if the estimated position of the internal teaching tool does not vary from a pre-determined position by more than a set amount.

3. The method for teaching a position of a wafer according to claim 1,
    wherein said internal teaching tool is disposed at a center position of said container or processing equipment and has a disk shape with a shaft protruding upwards therefrom, and
    wherein said at least two external teaching tools have a vertical cylindrical shape and are attached to said front wall of the container or processing equipment by a support piece.

4. A teaching tool system, comprising:
    a container or processing equipment comprising
    at least two external teaching tools, and
    an internal teaching tool mounted in an interior of the container or processing equipment,
    a robot for carrying a semiconductor wafer between the container and processing equipment or among processing equipments, the robot having a sensor on a wafer gripping portion which holds and carries the semiconductor wafer to the interior of the container or processing equipment,
    a controller which controls the robot and which roughly estimates the position of the internal teaching tool at an internal position of the controller or processing equipment based on the sensing of said at least two external teaching tools, the controller also determining the position of the internal teaching tool based on the sensing of the internal teaching tool,
    wherein said at least two external teaching tools are mounted on a front external wall of the container or processing equipment in a horizontally offset manner.

5. The system according to claim 4, wherein the controller controls the robot such that the wafer gripping portion of the robot only approaches the internal teaching tool to sense the internal teaching tool using the sensor if the estimated position of the internal teaching tool does not vary from a predetermined position by more than a set amount.

6. The system according to claim 4,
    wherein said internal teaching tool is disposed at a center position of said container or processing equipment and has a disk shape with a shaft protruding upwards therefrom, and
    wherein said at least two external teaching tools have a vertical cylindrical shape and are attached to said front wall of the container or processing equipment by a support piece.

* * * * *